(12) United States Patent
Martchevskii

(10) Patent No.: US 8,271,062 B2
(45) Date of Patent: Sep. 18, 2012

(54) SUPERCONDUCTING STRUCTURE FOR A FAULT CURRENT-LIMITER

(75) Inventor: Maxim Martchevskii, Houston, TX (US)

(73) Assignee: Superpower, Inc., Schenectady, NY (US)

( * ) Notice: Subject to any disclaimer, the term of this patent is extended or adjusted under 35 U.S.C. 154(b) by 601 days.

(21) Appl. No.: 12/430,150

(22) Filed: Apr. 27, 2009

(65) Prior Publication Data

US 2010/0273657 A1    Oct. 28, 2010

(51) Int. Cl.
*H01L 39/24* (2006.01)
*H01L 39/00* (2006.01)
*H01B 12/02* (2006.01)
*H02H 3/00* (2006.01)

(52) U.S. Cl. ........ 505/230; 505/434; 505/850; 505/881; 361/19; 361/8; 338/13; 338/32 S; 174/125.1; 29/599

(58) Field of Classification Search .............. 505/100, 505/124, 150, 220, 230, 231, 237–238, 430, 505/431, 434, 850, 879, 881; 361/19, 93.1, 361/93.7–93.9; 335/216; 338/32 S; 174/125.1; 29/599
See application file for complete search history.

(56) References Cited

U.S. PATENT DOCUMENTS

| | | | | |
|---|---|---|---|---|
| 5,079,223 A | * | 1/1992 | Maroni | 505/473 |
| 6,475,958 B1 | * | 11/2002 | Paul et al. | 505/100 |
| 6,664,875 B2 | | 12/2003 | Yuan et al. | |
| 7,440,244 B2 | | 10/2008 | Yuan et al. | |
| 2003/0164749 A1 | * | 9/2003 | Snitchler et al. | 338/32 S |
| 2007/0238619 A1 | | 10/2007 | Xiong | |

* cited by examiner

*Primary Examiner* — Stanley Silverman
*Assistant Examiner* — Kallambella Vijayakumar
(74) *Attorney, Agent, or Firm* — Kevin P. Radigan, Esq.; Heslin Rothernberg Farley & Mesiti P.C.

(57) ABSTRACT

A superconducting article and method of fabrication are provided. The superconducting article includes a superconducting structure, which includes a superconducting conductor and multiple discrete overlay regions of higher heat capacity than the superconducting conductor. The multiple discrete overlay regions are disposed along a length of the superconducting conductor, in thermal contact with the superconducting conductor, and positioned to define a heat modulation pattern along the length of the superconducting structure. The multiple discrete overlay regions create a temperature distribution favorable to transition of the superconducting structure under load from a normal resistive state to a superconductive state by facilitating formation of a continuous superconducting path along the length of the superconducting structure. In one implementation, the multiple discrete overlay regions are multiple island regions periodically disposed adjacent to opposing first and second edges of the superconducting conductor along the length of the superconducting conductor.

15 Claims, 7 Drawing Sheets

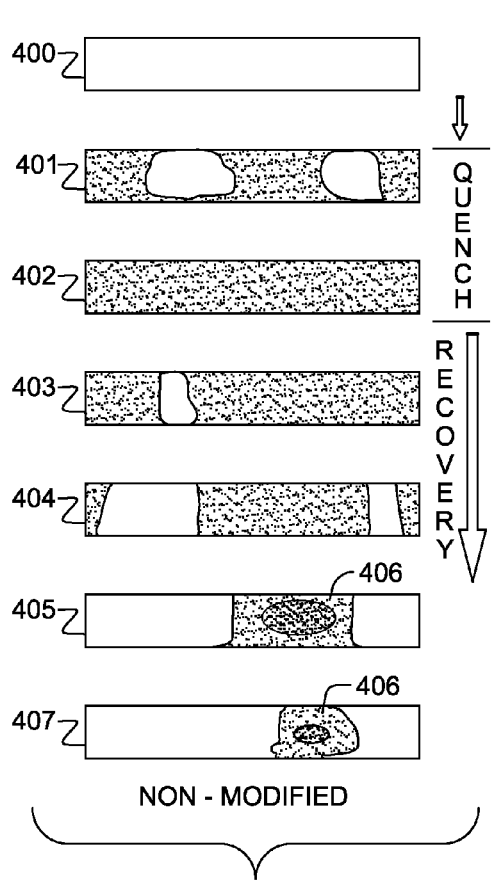
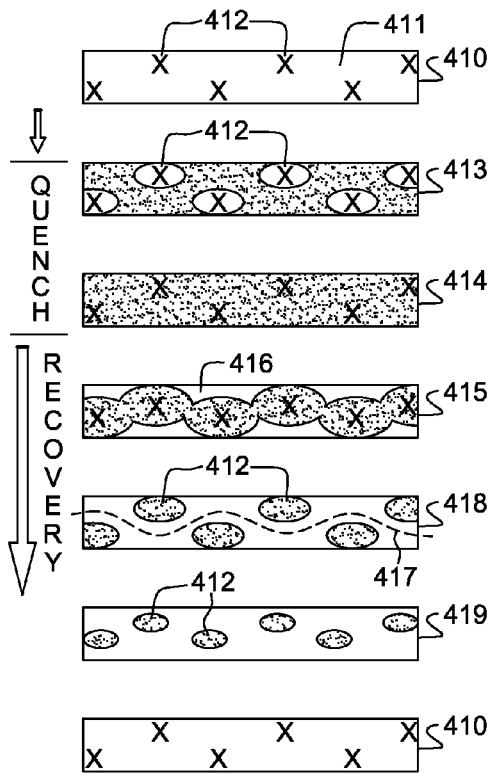
FIG. 4A      FIG. 4B
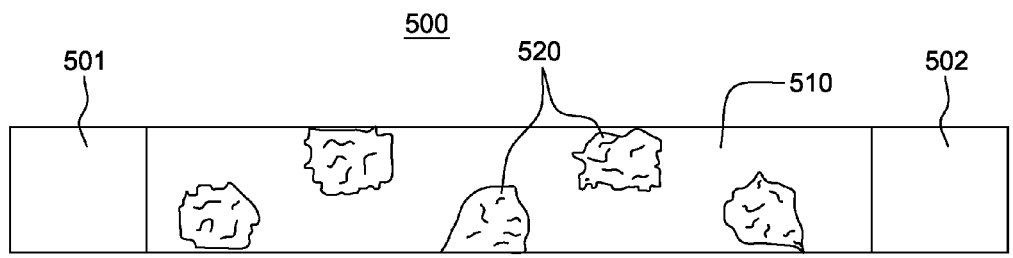
FIG. 5

SUPERCONDUCTING STRUCTURE FOR A FAULT CURRENT-LIMITER

TECHNICAL FIELD

The present invention relates in general to current-limiters, and more particularly, to a superconducting structure for a superconducting fault current-limiter which is configured to facilitate recovery under load.

BACKGROUND OF THE INVENTION

Current-limiting devices are critical in electric power transmission and distribution systems. For various reasons, such as a lightning strike, a short circuit condition can develop in a section of a power grid causing a sharp surge in current. If this surge of current, which is often referred to as fault current, exceeds the protective capabilities of the switchgear equipment deployed throughout the grid system, it could cause catastrophic damage to the grid equipment and the customer loads that are connected to the system.

Superconductors, especially high-temperature superconducting (HTS) materials, are well suited for use in a current-limiting device because of their intrinsic properties that can be manipulated to achieve the effect of "variable-impedance" under certain operating conditions. A superconductor, when operated within a certain temperature and external magnetic field range (i.e., the "critical temperature" ($T_c$) and "critical magnetic field ($H_c$) range), exhibits no electrical resistance if the current flowing through it is below a certain threshold (i.e., the "critical current level ($I_c$)), and is therefore said to be in a "superconducting state". However, if the current exceeds this critical current level, the superconductor will undergo a transition from its superconducting state to a "normal resistive state". This transition of a superconductor from its superconducting state to normal resistive state is termed "quenching". Quenching can occur if any one or any combination of the three factors, namely the operating temperature, external magnetic field or current level, exceeds the corresponding critical level. Mechanisms, using any one or a combination of these three factors, to induce and/or force a superconductor to quench, is usually referred to as a trigger mechanism.

A superconductor, once quenched, can be brought back to its superconducting state by bringing the operating environment to within the boundaries of its critical current, critical temperature and critical magnetic field range, provided that no thermal or structural damage was done during the quenching of the superconductor. HTS material can operate near the liquid nitrogen temperature (77° K) as compared with low-temperature superconducting (LTS) material that operates near liquid helium temperature (4° K). Manipulating properties of HTS material is thus much easier because of its higher and broader operating temperature range.

For some HTS materials, such as bulk BSCCO, YBCO and $MgB_2$, there often exists within the volume of the superconductor non-uniform regions resulting from the manufacturing process. Such non-uniform regions can develop into the so-called "hot spots" during the surge of current that exceeds the critical current level of the superconductor. Essentially, at the initial stage of quenching by the current, some regions of the superconductor volume become resistive before others do due to non-uniformity. A resistive region will generate heat at these non-uniform regions from its associated $i^2r$ loss. If the heat generated could not be propagated to its surrounding regions and environment quickly enough, the localized heating will damage the superconductor and could lead to the breakdown (burn-out) of the entire superconductor element.

Additionally, these non-uniform hot spot regions can inhibit recovery transition of the superconducting material under load after a fault current pulse. Specifically, during a transition under load, these hot areas (or hot spots) may remain in normal resistive state indefinitely, dissipating heat under the load current. Thus, the non-uniform local variations in critical current and heat transfer (e.g., due to the formation of nitrogen bubbles) along the conductor make designing a fault current-limiter with fast recovery under load capabilities challenging.

SUMMARY OF THE INVENTION

Briefly summarized, in one aspect, the present invention comprises a superconducting article which includes a superconducting structure comprising a superconducting conductor and multiple discrete overlay regions of higher heat capacity than the underlying superconducting conductor. The multiple discrete overlay regions of higher heat capacity are disposed along a length of the superconducting conductor, thermally coupled to the superconducting conductor, and positioned to define a heat modulation pattern along the length of the superconducting conductor conducive to transitioning the superconducting structure under load from a normal resistive state to a superconducting state.

In another aspect, a superconducting article is presented which includes a superconducting structure comprising multiple regions of higher heat capacity. The multiple regions of higher heat capacity are disposed along a superconducting conductor of the superconducting structure to modulate heat capacity of the superconducting structure and create a temperature distribution favorable to transition of the superconducting structure under load from a normal resistive state to a superconducting state by facilitating formation of a continuous superconducting path along the superconducting conductor.

In yet another aspect, a superconducting article is presented which includes a superconducting structure configured to at least partially resistively quench a fault current passing therethrough. Responsive to the fault current, the superconducting structure transitions from a superconducting state to a normal resistive state. The superconducting structure includes multiple regions of higher heat capacity which are positioned along the superconducting structure to facilitate recovery transition of the superconducting structure under load from the normal resistive state to the superconducting state after quenching of the fault current. The superconducting structure includes a superconducting conductor comprising a first material and the multiple regions of higher heat capacity comprise a second material, wherein the second material has a higher heat capacity and a lower electrical conductivity than the first material.

In a further aspect, a method of fabricating a superconducting article is provided. The method includes: forming a superconducting structure, the forming comprising: forming a superconducting conductor; and disposing multiple discrete overlay regions of higher heat capacity in thermal contact with the superconducting conductor along a length of the superconducting conductor, wherein the disposing includes positioning the multiple discrete regions of higher heat capacity along the length of the superconducting conductor to define a heat modulation pattern along the length of the superconducting conductor conducive to transitioning the superconducting structure under load from a normal resistive state to a superconducting state.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 4A & 4B depict recovery under load of an unmodified length of superconducting conductor and recovery under load of a modified superconducting structure, respectively, in accordance with an aspect of the present invention;

FIG. 5 is a plan view of one embodiment of a superconducting structure, in accordance with an aspect of the present invention;

DETAILED DESCRIPTION OF THE INVENTION

The superconducting fault current-limiters described herein may be employed with any low-temperature or high-temperature superconducting material. However, advantage is obtained by employing a high-temperature superconductor (HTS) as the superconductor segment(s) or structure(s) within the superconducting element(s) of the superconducting fault current-limiters presented herein. Such conductors can today be configured for self-triggering responsive to a fault current, that is, to change states from a superconducting state to a normal resistive state for limiting of the fault current based on the higher current value of the fault current itself. Before describing superconducting fault current-limiters further, an HTS superconductor segment for a superconducting element (such as discussed herein) is described below with reference to FIG. 1.

Figure 1:
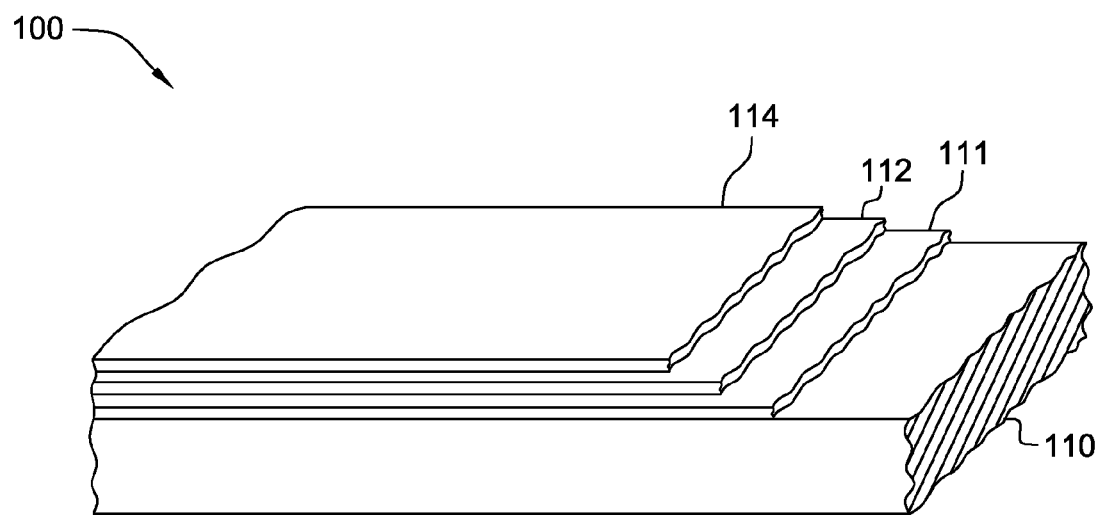
FIG. 1 illustrates one embodiment of a high-temperature superconducting (HTS) conductor which may be modified for use in a superconducting article, such as a superconducting fault current-limiter, in accordance with an aspect of the present invention.

Referring to FIG. 1, the general layered structure of an HTS conductor 100 is depicted which can be employed as the superconducting element, or a portion of the superconducting element (e.g., in parallel with a plurality of such superconductor segments), of a superconducting fault current-limiter, in accordance with the present invention. The HTS conductor 100 includes a substrate 110, a buffer layer 111 overlying substrate 110, an HTS layer 112, followed by a capping layer 114, (typically a noble metal layer). In the embodiment depicted in FIG. 1, buffer layer 111, HTS layer 112, and capping layer 114 are collectively referred to as the superconducting region of the superconducting conductor, which as illustrated, is disposed along one main surface of substrate 110.

Substrate 110 is typically in a tape-like configuration, having a high aspect ratio. For example, the width of the tape is generally on the order of about 2-12 mm, and the length of the tape is typically at least about 100 m, most typically greater than about 500 m. Accordingly, the substrate may have an aspect ratio which is fairly high, on the order of not less than $10^3$, or even not less than $10^4$. Certain embodiments are longer, having an aspect ratio of $10^5$ and higher. As used herein, the term 'aspect ratio' is used to denote the ratio of the length of the substrate or tape to the next longest dimension, that is, the width of the substrate or tape.

In one embodiment, the substrate is treated so as to have desirable surface properties for subsequent deposition of the constituent layers of the HTS tape. For example, the surface may be lightly polished to a desired flatness and surface roughness. Additionally, the substrate may be treated to be biaxially textured as is understood in the art, such as by the known RABiTS (roll assisted biaxially textured substrate) technique.

Turning to buffer layer 111, the buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD is an acronym for Ion Beam Assisted Deposition, a technique which may be advantageously utilized to form a suitably textured buffer layer for subsequent formation of an HTS layer having desirable crystallographic orientation for superior superconducting properties. Magnesium oxide is a typical material of choice for the IBAD film, and may be on the order or 50 to 500 Angstroms, such as 50 to 200 Angstroms. Generally, the IBAD film has a rock-salt like crystal structure, as defined and described in U.S. Pat. No. 6,190,752, which is incorporated herein by reference in its entirety.

The buffer layer may include additional films, such as a barrier film provided to directly contact and be placed in between an IBAD film and the substrate. In this regard, the barrier film may advantageously be formed of an oxide, such as yttria, and functions to isolate the substrate from the IBAD film. A barrier film may also be formed of non-oxides such as silicon nitride and silicon carbide. Suitable techniques for deposition of a barrier film include chemical vapor deposition and physical vapor deposition including sputtering. Typical thicknesses of the barrier film may be within a range of about 100-200 angstroms. Still further, the buffer layer may also include an epitaxially grown film, formed over the IBAD film. In this context, the epitaxially grown film is effective to increase the thickness of the IBAD film, and may desirably be made principally of the same material utilized for the IBAD layer such as MgO.

In embodiments utilizing an MgO-based IBAD film and/or epitaxial film, a lattice mismatch between the MgO material and the material of the superconducting layer exists. Accordingly, the buffer layer may further include another buffer film, this one in particular implemented to reduce a mismatch in lattice constants between the HTS layer and the underlying IBAD film and/or epitaxial film. This buffer film may be formed of materials such as YSZ (yttria-stabilized zirconia) strontium ruthenate, lanthanum manganate, and generally, perovskite-structured ceramic materials. The buffer film may be deposited by various physical vapor deposition techniques.

While the foregoing has principally focused on implementation of a biaxially textured film in the buffer stack (layer) by a texturing process such as IBAD, alternatively, the substrate surface itself may be biaxially textured. In this case, the buffer layer is generally epitaxially grown on the textured substrate so as to preserve biaxial texturing in the buffer layer. One process for forming a biaxially textured substrate is the process known in the art as RABiTS (roll assisted biaxially textured substrates), generally understood in the art.

High-temperature superconductor (HTS) layer 112 is typically chosen from any of the high-temperature superconducting materials that exhibit superconducting properties above the temperature of liquid nitrogen, 77° K. Such materials may include, for example, $YBa_2Cu_3O_{7-x}$, $Bi_2Sr_2Ca_2Cu_3O_{10+y}$, $Ti_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$ also generally referred to as YBCO, may be advantageously utilized. The HTS layer 112 may be formed by anyone of various techniques, including thick and thin film forming techniques. Preferably, a thin film physical vapor deposition technique such as pulsed laser deposition (PLD) or a metal organic chemical vapor deposition (MOCVD) can be used for a high deposition rates, or a chemical vapor deposition technique can be used for lower cost and larger surface area treatment. Typically, the HTS layer has a thickness on the order of about 1 to about 30 microns, most typically about 1 micron, in order to get desirable amperage ratings associated with the HTS layer 112.

Capping layer 114 is generally implemented for electrical stabilization, that is, to aid in prevention of HTS burnout in practical use. More particularly, layer 114 aids in continued flow of electrical charges along the HTS conductor in cases where cooling fails or the critical current density is exceeded, and the HTS layer moves from the superconducting state to the normal resistive state. Conventionally, a noble metal is utilized for capping layer 114. Typical noble metals include gold, silver, platinum, and palladium. Silver is typically used due to its cost and general accessibility. Capping layer 114 is normally generally thin for cost reasons (raw material and processing costs). Typical thicknesses of capping layer 114 range within about 0.1 to about 10.0 microns, such as 0.5 to about 5.0 microns. Various techniques may be used for deposition of capping layer 114, including physical vapor deposition, such as DC magnetron sputtering.

Those skilled in the art should note that the above-description of HTS conductor 100 of FIG. 1 is provided by way of example only. The superconducting elements or superconducting structures, discussed hereinbelow may utilize any appropriate superconducting conductor (tape or bulk material), without departing from the scope of the claims provided herewith.

Figure 2:
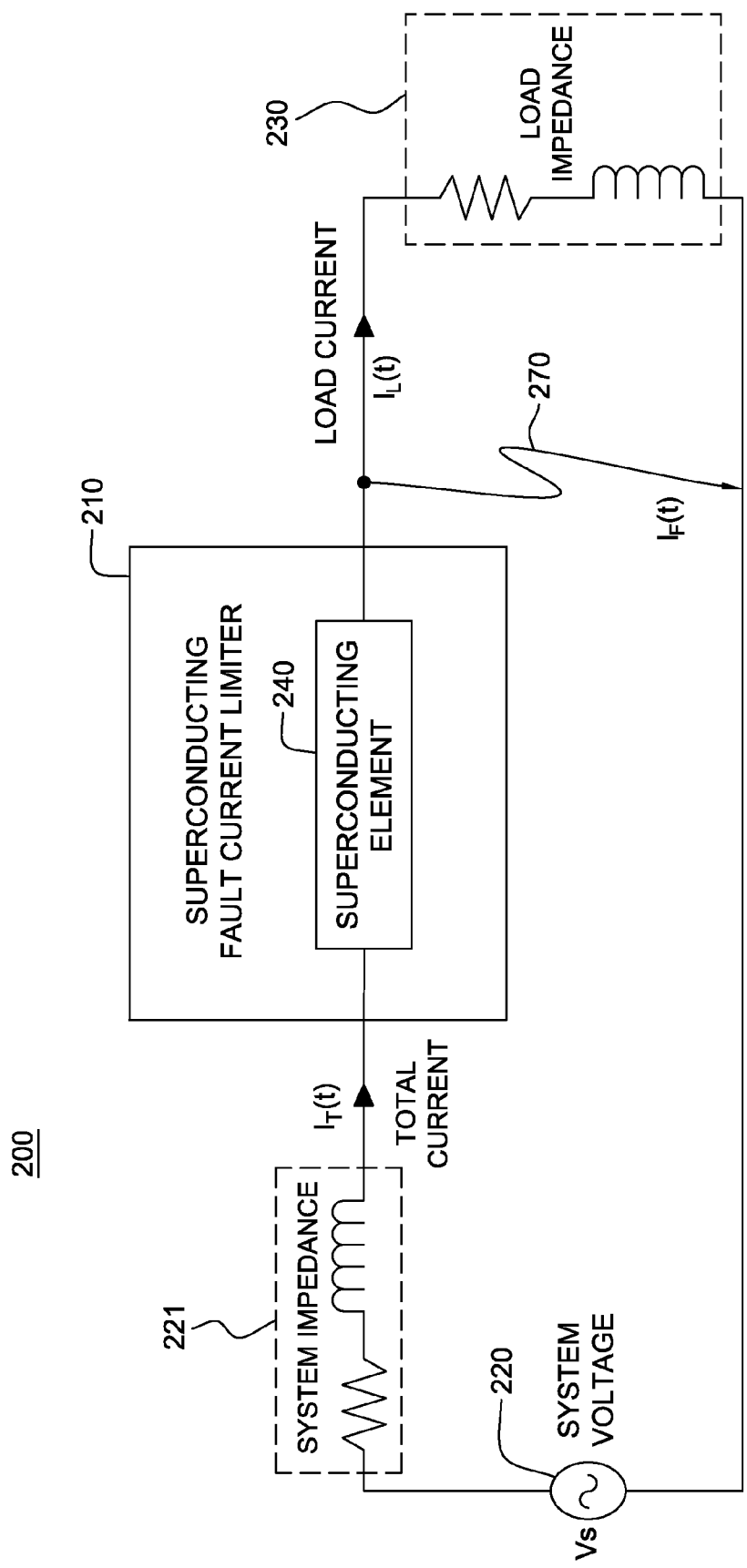
FIG. 2 is a schematic of one embodiment of an electrical system, such as a power grid system, employing one or more superconducting fault current-limiters, in accordance with an aspect of the present invention.

FIG. 2 is a schematic of one embodiment of an electrical system 200, such as a power distribution system or network, which includes one or more superconducting fault current-limiters 210, in accordance with an aspect of the present invention. As one example, the electrical system is a power grid, wherein system voltage 220 is supplied across transmission and/or distribution lines (having system impedance 221) and superconducting fault current-limiter 210 to a load impedance 230. Superconducting fault current-limiter 210 comprises a superconducting element 240.

As illustrated, a load current $I_L(t)$ powers the load impedance 230. Upon occurrence of a fault current 270, such as a short circuit fault current $I_F(t)$, the total current $I_T(t)$ increases significantly due to the short circuit. In the embodiments described herein, the superconducting fault current-limiter, and in particular, superconducting element 240, is configured to resistively limit this fault current by quenching or transitioning from superconducting state to normal resistive state. As noted, a superconducting fault current-limiter (in accordance with the present invention) includes at least one superconducting element, such as an HTS element.

Under normal operating conditions, the superconducting element will have no resistance. Consequently, there is no voltage drop across the element. Once a fault current occurs, however, the current surge will exceed the critical current level of the superconducting element and cause it to quench immediately, thus generating a voltage drop across the superconducting element. A parallel connected shunt (not shown) may be provided to limit the voltage generated by the superconductor and share the total current load to ensure that the superconductor does not overheat and can return to its normal state once the fault has been removed or partially removed.

Using the above-described arrangement as a base module, a matrix current-limiter can be configured to have at least one row and at least one column of such modules, wherein each module is coupled in parallel with each other module in each column, and each column is coupled in series with each other column. The modular nature of such a superconducting fault current-limiter makes it adaptable to high voltage and/or high current operating environments of a power system to which it connects.

Advantageously, a matrix fault current-limiter can be highly modular and scalable, so that the superconducting fault current-limiter assembly can be designed and sized to accommodate various fault current-limiting application requirements. The modular nature of this matrix-type superconducting fault current-limiter makes it extremely adaptable to high voltage and/or high current operating requirements of a power system to which it connects. For high voltage applications, the total voltage is divided amongst the multiple columns of the matrix assembly, which substantially simplifies the dielectric design of the matrix-type superconducting fault current-limiter to meet various high voltage insulation requirements. Furthermore, combinations of different numbers of rows and columns can be used to address applications that have both high voltage and high current operating requirements, and different current-limiting requirements.

When a fault occurs in the electrical power system, the surge current flowing through the matrix-type, superconducting fault current-limiter increases to multiples of the normal operating current. Consequently, the superconducting elements will begin to transition from a superconducting state to a normal resistive state, also called "quenching". The resistance or inductance generated by the superconducting elements in this quench state will cause a voltage to be generated across the superconducting elements. This voltage will then generate a current through any shunts (not shown) since they are electrically coupled in parallel with the superconducting elements. Once the initial quench starts, the subsequent $i^2r$ heating within the superconducting elements contributes to the quenching process. Together, the current surge and the temperature rise operate to promote a fast and uniform quenching of the superconducting elements and to prevent burn-out due to material defects. The modularity of the matrix-type, superconducting fault current-limiter provides built-in redundancy in the design such that a failure in any individual superconductor (or superconducting element) in the fault current-limiter does not result in failure of the entire device.

Figure 3B:
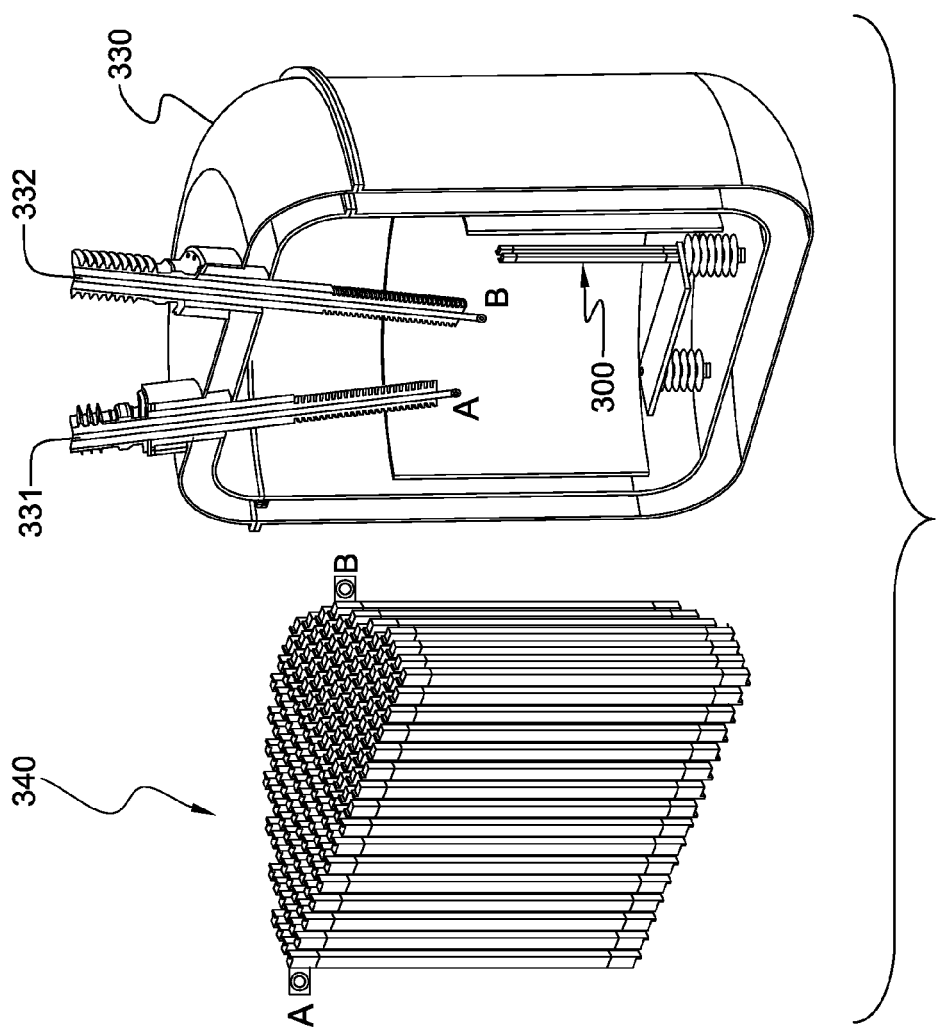
FIG. 3B is a partially exploded, partial perspective view of the matrix-type, superconducting fault current-limiter of FIG. 3A, in accordance with an aspect of the present invention.
Figure 3A:
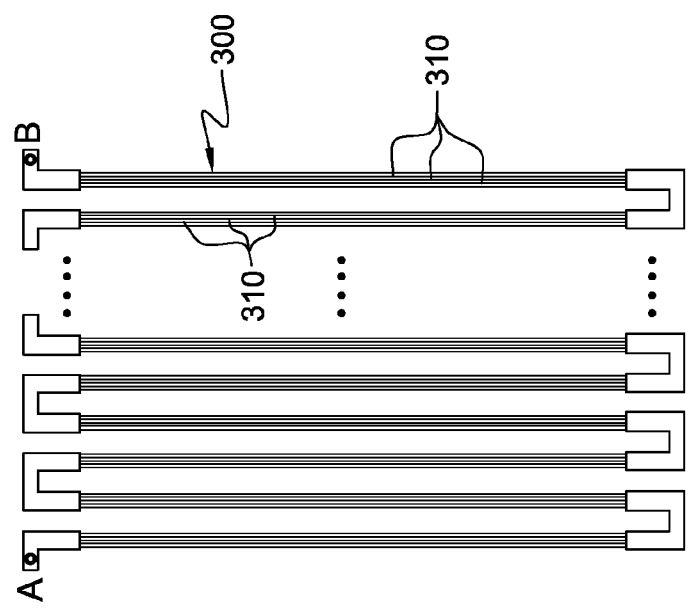
FIG. 3A is a partial elevational view of a matrix-type, superconducting fault current-limiter implementation, in accordance with an aspect of the present invention.

One practical implementation of a matrix-type, superconducting fault current-limiter is depicted in FIGS. 3A & 3B. In this example, each current-limiting module (or column) comprises at least one superconducting element, each of which comprises a plurality of superconductor segments or conductors.

Referring first to FIG. 3A, a matrix-type, superconducting fault current-limiter is presented wherein a current-limiting module 300 (e.g., comprising a column of fault current-limiters) comprises, in this configuration, one or more series, electrically connected superconducting elements 310, each comprising a plurality of superconductors, such as a plurality of layers of superconducting tape coupled in parallel. These current-limiting modules are connected in series between a first primary connection A and a second primary connection B. The size, configuration and number of superconductors within each current-limiting module 300 may vary, depending on the high voltage and high current operating requirements of a particular implementation, and the different current-limiting requirements. In one example, each superconductor layer (or tape) comprises an HTS conductor. Additionally, although not shown, each superconducting element 310 may comprise a shunt coupled in parallel with the plurality of layers of superconducting tape.

FIG. 3B depicts a partially exploded, cross-sectional view of the matrix-type, superconducting fault current-limiter partially shown in FIG. 3A. In this embodiment, the individual fault current-limiter modules 300, which are connected in series between primary contacts A & B, are exploded from the vessel 330, which is sized to house the matrix. By way of example, a single current-limiting module 300 is illustrated in position within vessel 330. As illustrated, power lines 331, 332 connect to matrix 340 via the primary connections A & B to the matrix. In this implementation, a single-phase, fault current-limiting structure is depicted. In a three-phase embodiment, each phase would have a fault current-limiting structure such as depicted. Alternatively, the vessel could be reconfigured such that the fault current-limiting structures for each phase of a three phase implementation would be contained within a single vessel. In operation, a coolant, such as liquid nitrogen, is pumped through the vessel to ensure that the superconducting elements remain at a temperature conducive to establishing and remaining in superconducting state. The superconducting fault current-limiter described herein resistively or inductively limits the fault current with quenching from the superconducting state to the normal resistive state of the individual superconducting elements. This resistive or inductive limiting results in a temperature rise within the vessel, which is removed by the liquid nitrogen as it is pumped through the vessel.

Those skilled in the art will note from the above discussion, that the particular embodiment of FIGS. 3A & 3B is one example only of a superconducting fault current-limiter to employ the superconducting structure described hereinbelow.

As noted initially, a major requirement for practical implementation of a superconducting fault current limiter is the ability to recover under load after a fault current pulse. Non-uniform local variations in critical current and heat transfer (e.g. due to the formation of bubbles) in today's superconducting conductors make designing a fault current limiter with fast recovery under load challenging. The superconducting structures described herein are presented to address this challenge.

Generally stated, presented herein is a superconducting article and method of fabrication which include a superconducting structure comprising a superconducting conductor and multiple discrete overlay regions of higher heat capacity. The multiple discrete overlay regions (or multiple island regions) of higher heat capacity are periodically disposed along a length of the superconducting conductor, for example, in an alternating pattern adjacent to opposing first and second side edges of the superconducting conductor. The multiple discrete overlay regions of higher heat capacity are thermally coupled to the superconducting conductor and positioned to define a heat modulation pattern along the length of the superconducting conductor conducive to transitioning the superconducting structure under load from a normal resistive state to a superconducting state subsequent to quenching of a fault current. Although described herein as overlay regions, the concepts described are applicable to any superconducting structure wherein the structure is patterned (or predefined) with different regions of heat capacity conducive to transitioning the superconducting structure under load from normal resistive state to superconducting state subsequent to quenching of a fault current.

FIG. 4A depicts a conventional, unmodified superconducting conductor in superconducting state 400 (such as the above-described HTS conductor of FIG. 1). Responsive to a fault current pulse, the superconducting conductor begins to transition from superconducting state to a normal resistive state as shown in step 401. In step 402, the superconducting conductor is fully in normal resistive state 402 and a voltage has been generated across the conductor as described above. After quenching the fault current, the conductor begins through cooling to return to superconducting state following the evolution of the local temperature profile along the length of the conductor (see steps 403-404). Non-uniformities in the conductor may result in creation of a hot spot region 406 extending the full width of the conductor, as shown in step 405. Hot spot region 406 can inhibit or at least delay recovery transition of the superconducting conductor under load. In step 407, additional time has passed, but the hot spot 406 continues to block full recovery of the conductor to superconducting state. This is because the load current continues to dissipate heat in the hot spot region, preventing the region from returning to superconducting state.

FIG. 4B depicts a modified superconducting structure, in accordance with an aspect of the present invention, which is initially in superconducting state 410. As shown, superconducting structure 410 includes a superconducting conductor 411, such as the above-described HTS conductor of FIG. 1, modified with a pattern of discrete overlay regions 412 of higher heat capacity. These multiple regions of higher heat capacity are disposed along the superconducting conductor to modulate heat capacity of the superconducting structure and create a temperature distribution favorable to transition of the superconducting structure under load from normal resistive state to superconducting state by facilitating formation of a continuous superconducting path along the length of the superconducting conductor structure.

Modulation of heat capacity is achieved, in one embodiment, by placing additional material in regular intervals along the superconducting conductor. For example, the additional material defining the discrete overlay regions 412 may be placed in an alternating pattern adjacent to opposing first and second edges of the superconducting conductor 411 as illustrated in FIG. 4B. Note that the concepts presented herein are applicable to other pattern configurations as well. For example, smaller overlay regions than illustrated herein may be employed to facilitate use of different patterning approaches. The goal of the added material is to modulate the heat capacity of the superconducting conductor structure along the length of the superconducting conductor to create a temperature distribution, as well as a coolant boiling distribution favorable to transfer of heat from the superconducting structure to the surrounding coolant during recovery of the superconducting structure from normal resistive state to superconducting state. Using this approach, the randomness of the normal domain distribution described above in connection with FIG. 4A is removed and formation of large hot spots, such as hot spot 406 in FIG. 4A, is suppressed along the superconducting conductor.

As shown in FIG. 4B, the overlay regions of higher heat capacity 412 stay in superconducting state subsequent to a fault current pulse for a period of time slightly longer than the superconducting conductor 411, which is shown in step 413 to be in normal resistive state. Subsequently, the entire superconducting structure is in normal resistive state 414. During the recovery process, the regions of higher heat capacity remain in normal resistive state longer, while the superconducting conductor begins (typically along its edges) to transition to superconducting state 416, as shown in step 415. This process continues with the size of the normal resistive state regions below the overlay regions of higher heat capacity continuing to shrink until a superconducting path 417 is formed between the overlay regions 412, as shown in step 418. At this point, all load current passes through the superconducting path 417, allowing the superconducting structure to more quickly recover. The shrinking of the normal resistive state regions continues in step 419 until the entire superconducting conductor structure is in the superconducting state 410. As noted, placement of the heat capacity modifiers along the superconducting conductor breaks down the larger non-uniform domains of the unmodified conductor, thus preventing formation of a non-recovering hot spot region, as well as accelerating the recovery process.

FIG. 5 illustrates one experimental embodiment of a superconducting structure 500, in accordance with an aspect of the present invention. As shown, superconducting structure 500 comprises a superconducting structure 510, such as the above-described HTS conductor of FIG. 1, extending between a first contact 501 and a second contact 502. The superconducting conductor is modified by the addition of material in a defined pattern in multiple discrete overlay regions 520. In this embodiment, the overlay regions are island regions of an added material of higher heat capacity periodically disposed along the length of the superconducting conductor 510 in an alternating pattern adjacent to opposing first and second edges of the superconducting conductor. The material chosen for the overlay regions is selected to have a higher heat capacity and a lower electrical conductivity than the exposed material (e.g., the capping material) of superconducting conductor 510. In one embodiment, superconducting conductor 510 is assumed to have a capping layer which comprises silver. In such a case, indium is a good material for use in defining the multiple discrete overlay regions of higher heat capacity and thermal conductivity. Indium has a relatively high heat capacity and thermal conductivity yet it's resistively is lower than that of other metals, such as silver and copper. Note that the material used for forming the discrete overlay regions may be any material capable of providing the characteristics described herein. Indium is believed advantageous in that it is strongly adhesive to the silver surface of the superconducting conductor, and can be readily placed along the superconducting conductor using an appropriate heating device, such as a soldering iron or similar technique. However, other materials such as bismuth, tin, or lead may alternatively be employed. Each of these materials has a higher resistivity than silver, a good adhesion to silver, and a not-too-high melting temperature.

Figure 6:
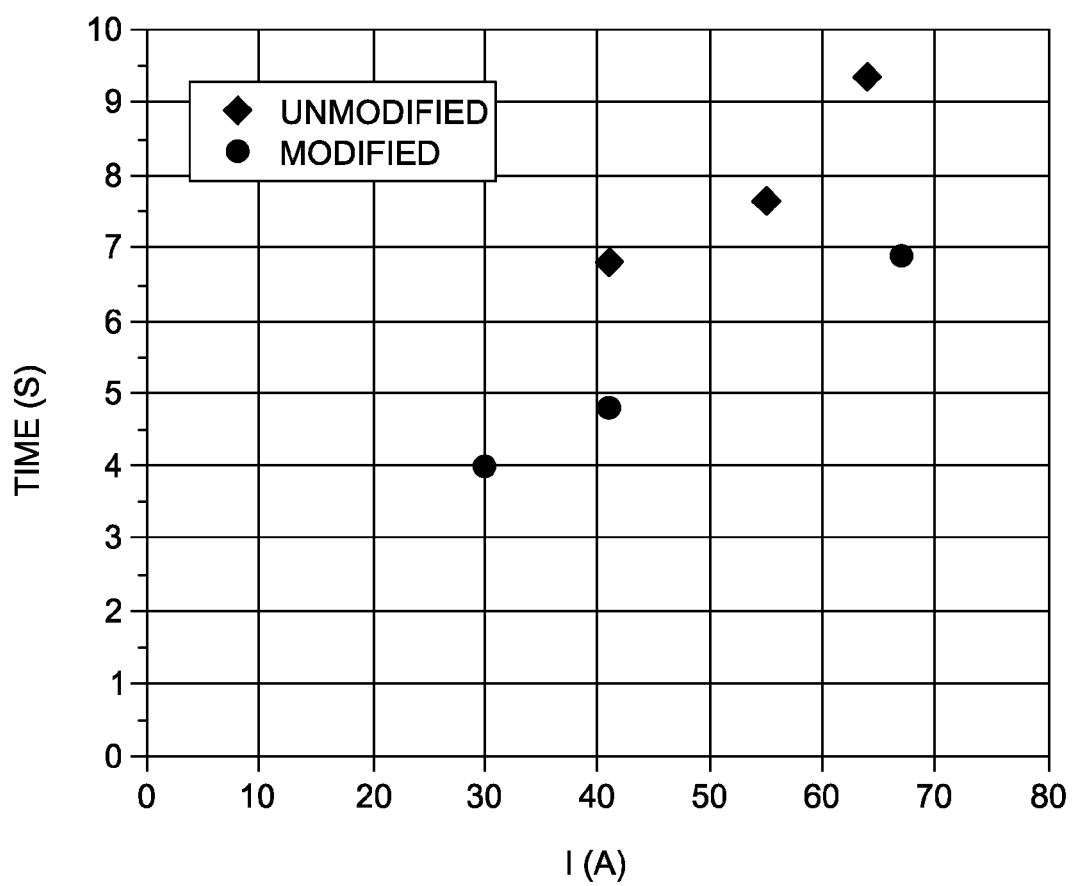
FIG. 6 is a graph of recovery time versus applied load current for an unmodified superconducting conductor and a modified superconducting structure, in accordance with an aspect of the present invention.

FIG. 6 is a plot of recovery time versus applied load current for the unmodified superconducting conductor of FIG. 4A compared with the modified superconducting structure of FIGS. 4B & 5. As shown, experimental recovery under load tests show improvement by placing islands (or dots) of higher heat capacity material on the superconducting conductor. By doing so, recovery times shorten by approximately 30% compared with the unmodified superconducting conductor of essentially the same critical current. As shown, recovery time generally increases for both embodiments with increasing applied load current.

Figure 7A:
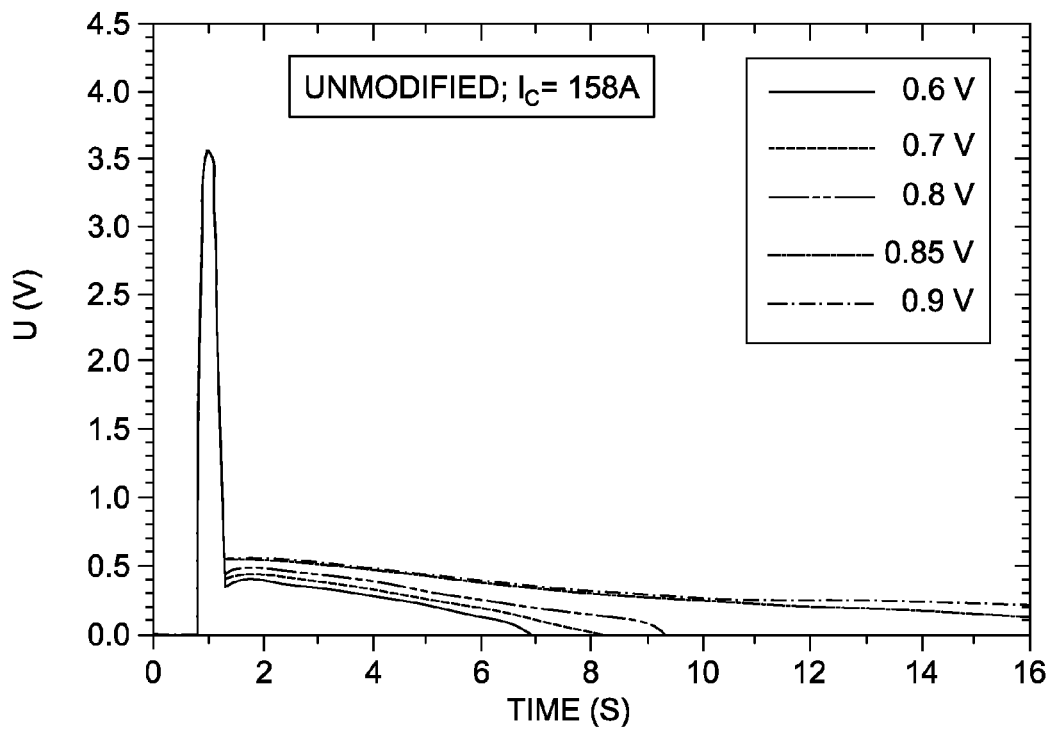
FIGS. 7A & 7B are graphs of voltage versus recovery time for different applied load voltages for an unmodified superconducting conductor and a modified superconducting structure, respectively, in accordance with an aspect of the present invention.
Figure 7B:
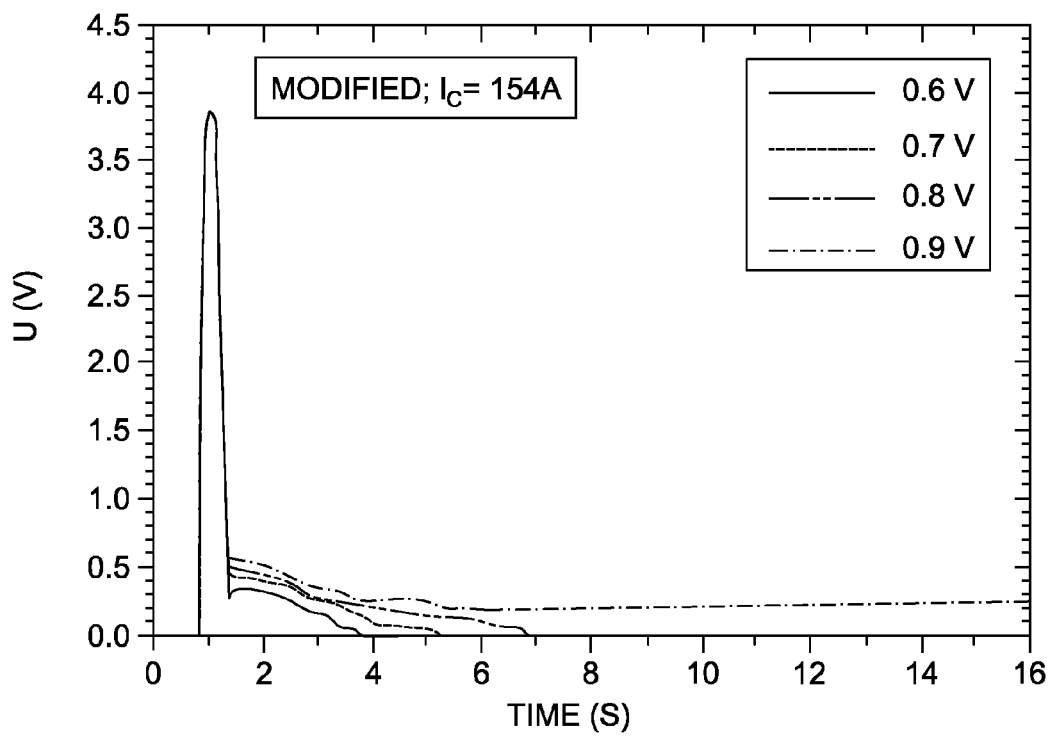

FIGS. 7A & 7B depict measured voltage versus recovery time for different applied load voltages for an unmodified superconducting conductor compared with a modified superconducting structure, such as depicted in FIGS. 4B & 5. As illustrated, for similar critical current ($I_c$) conductors, the measured voltage drops to zero (meaning that the conductor has entered superconducting state), significantly faster than in the case of the modified superconducting structure described above. For example, at 0.6 volts, the recovery time is four seconds for the modified superconducting structure, compared with seven seconds for the unmodified superconducting conductor. Further, for certain applied voltages, the unmodified superconducting conductor may be unable to recover while the modified superconducting structure is able to recover. This may be the case, for example, for a voltage of approximately 0.85 in the experimental example depicted.

Figure 8:
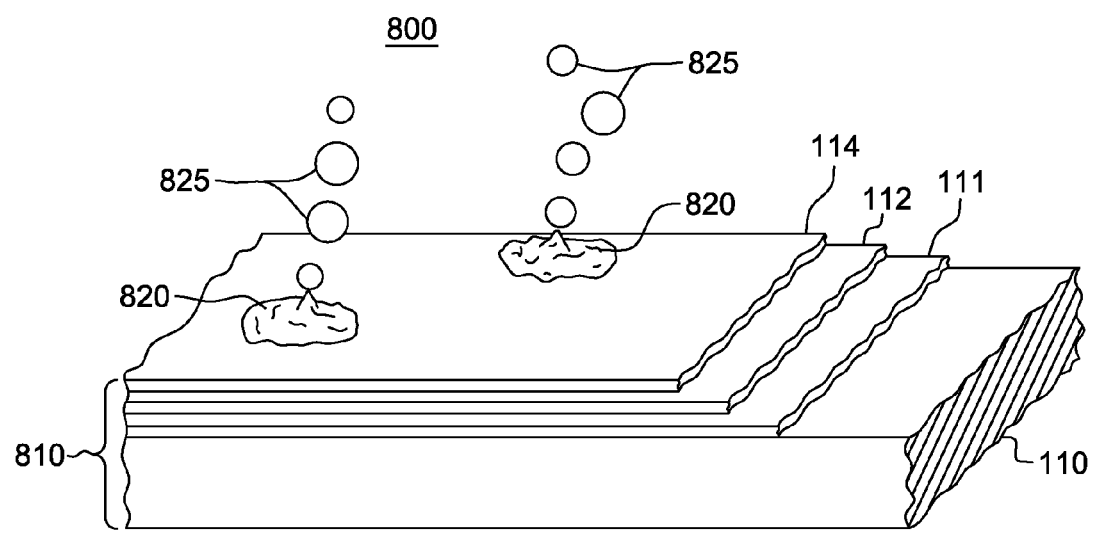
FIG. 8 illustrates one embodiment of a superconducting structure having multiple discrete overlay regions of higher heat capacity configured and positioned to facilitate distributed boiling of coolant surrounding the superconducting structure responsive to a fault current passing therethrough, in accordance with an aspect of the present invention.

FIG. 8 depicts a further embodiment of a superconducting structure 800, in accordance with an aspect of the present invention. In this embodiment, the superconducting structure 810 is assumed to comprise the above-described layers 110, 111, 112 & 114 of the HTS conductor depicted in FIG. 1. The superconducting conductor is modified by adding additional material in discrete overlay regions (or islands) onto capping layer 114. In one embodiment, these regions 820 of additional heat capacity material each comprise irregular structures (such as also depicted in FIG. 5) from which bubbles 825 readily form during quenching. By patterning the superconducting conductor with overlay regions, the resultant structure advantageously creates a coolant boiling distribution favorable to transfer of heat from the superconducting structure to the surrounding coolant. That is, providing multiple, distributed, localized boiling points (i.e., the overlay regions) results in the structure being less likely to form a larger bubble across, for example, the width of the superconducting conductor, which would inhibit heat transfer from the superconducting conductor to the surrounding coolant in that region.

In summary, heat modulation patterning is described herein as a technique for reducing recovery under load time of a fault current limiter application of a superconducting conductor, such as a second generation HTS conductor. Using this concept, a practical modification technique using indium "dots" is disclosed, and has been tested. Placing indium regions or dots on superconducting tape allows for the reduction of the recovery time of up to 30% in DC recovery under load tests, and up to 50% in AC superconducting fault current limiter tests. Note that the concepts disclosed are not limited to the particular pattern depicted, but that various patterns of added heat capacity regions may be employed. Further, the concepts disclosed are not limited to the application of indium regions to a silver capping layer, but rather any appropriate material may be used to modulate heat capacity of the superconducting structure and create the desired temperature and boiling distributions favorable to transition of the superconducting structure under load from normal resistive state to superconducting state. By selecting an appropriate pattern and spacing, formation of a continuous superconducting path is facilitated along the length of the superconducting structure.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A superconducting article comprising:
a superconducting structure comprising a superconducting conductor and multiple discrete overlay islands of higher heat capacity than the underlying superconducting conductor, the multiple discrete overlay islands of higher heat capacity electrically contacting the superconducting conductor and being non-continuous islands disposed along a length of the superconducting conductor; and
wherein the multiple discrete overlay islands of higher heat capacity are thermally coupled to the superconducting conductor and comprise areas of higher heat capacity positioned to define a heat modulation pattern along the length of the superconducting conductor conducive to transitioning the superconducting structure under load from a normal resistive state to a superconducting state, the multiple discrete overlay islands being configured and positioned to facilitate, during transitioning of the superconducting structure under load from the normal resistive state to the superconducting state, formation of a superconducting path within the superconducting conductor initially offset from the multiple discrete overlay islands.

2. The superconducting article of claim 1, wherein the multiple discrete overlay islands of higher heat capacity comprise multiple islands of higher heat capacity periodically disposed along the length of the superconducting conductor.

3. The superconducting article of claim 2, wherein the multiple islands of higher heat capacity periodically disposed along the length of the superconducting conductor each comprise a width taken transverse the length of the superconducting conductor which is less than 60% of a width of the superconducting conductor.

4. The superconducting article of claim 2, wherein the multiple islands of higher heat capacity periodically disposed along the length of the superconducting conductor are disposed in an alternating pattern adjacent to opposing first and second edges of the superconducting conductor.

5. The superconducting article of claim 1, wherein the multiple discrete overlay islands of higher heat capacity are configured and positioned to locally modulate heat capacity along the length of the superconducting conductor to facilitate formation of the superconducting path in between the multiple discrete overlay islands during recovery transition of the superconducting structure under load from the normal resistive state to the superconducting state.

6. The superconducting article of claim 1, wherein the multiple discrete overlay islands of higher heat capacity disposed along the length of the superconducting conductor comprise a first material and the superconducting conductor comprises a second material, the first material having a higher heat capacity and a lower electrical conductivity than the second material.

7. The superconducting article of claim 1, wherein the multiple discrete overlay islands of higher heat capacity disposed along the length of the superconducting conductor are configured and positioned to facilitate a distributed boiling of coolant during quenching of a fault current passing through the superconducting structure, the distributed boiling of coolant facilitating recovery transition of the superconducting structure under load from the normal resistive state to the superconducting state.

8. A superconducting article comprising:
a superconducting structure comprising multiple islands of higher heat capacity, wherein the multiple islands of higher heat capacity are disposed along and electrically contact a superconducting conductor of the superconducting structure to modulate heat capacity of the superconducting structure and are sized and positioned to create a temperature distribution favorable to transition of the superconducting structure under load from a normal resistive state to a superconducting state by facilitating initial formation of a continuous superconducting path along the superconducting conductor offset from the multiple islands of higher heat capacity.

9. The superconducting article of claim 8, wherein the multiple islands of higher heat capacity disposed along the superconducting conductor are configured and positioned to create a coolant boiling distribution favorable to transfer of heat from the superconducting structure to surrounding coolant during quenching of a fault current passing through the superconducting structure.

10. The superconducting article of claim 8, wherein the multiple islands of higher heat capacity comprise multiple islands of higher heat capacity periodically positioned along a length of the superconducting conductor.

11. The superconducting article of claim 8, wherein the multiple islands of higher heat capacity each comprise a width taken transverse a length of the superconducting conductor which is less than a 60% of width of the superconducting conductor.

12. The superconducting article of claim 8, wherein the multiple islands of higher heat capacity comprise multiple islands of higher heat capacity periodically disposed along a length of the superconducting conductor in an alternating pattern adjacent to opposing first and second edges of the superconducting conductor.

13. A superconducting article comprising:
a superconducting structure configured to at least partially resistively quench a fault current passing therethrough, wherein the superconducting structure transitions from a superconducting state to a normal resistive state responsive to the fault current passing therethrough; and
wherein the superconducting structure comprises a superconducting conductor and multiple islands of higher heat capacity electrically contacting the superconducting conductor, the multiple islands of higher heat capacity being positioned along the superconducting structure to facilitate recovery transition of the superconducting structure from the normal resistive state to the superconducting state under load after quenching of the fault current, and wherein the superconducting structure comprises a superconducting conductor comprising a first material and the multiple islands of higher heat capacity comprise a second material, the second material having a higher heat capacity and a lower electrical conductivity than the first material, the multiple islands being configured and positioned to facilitate, during transitioning of the superconducting structure under load from the normal resistive state to the superconducting state, formation of a superconducting path within the superconducting conductor initially offset from the multiple discrete overlay islands.

14. The superconducting article of claim 13, wherein the multiple islands of higher heat capacity are configured and positioned to further facilitate distributed boiling of coolant surrounding the superconducting structure during quenching of the fault current passing therethrough, and wherein the multiple islands of higher heat capacity are positioned along the superconducting structure to create a temperature distribution favorable to transition of the superconducting structure from normal resistive state to superconducting state by facilitating the initial formation of the superconducting path in between the multiple islands of higher heat capacity through the superconducting structure.

15. The superconducting article of claim 13, wherein the second material comprises indium, and the first material comprises silver, and wherein the superconducting article is a superconducting fault current-limiter.

\* \* \* \* \*